United States Patent [19]
Syouji et al.

[11] Patent Number: 5,903,460
[45] Date of Patent: May 11, 1999

[54] METHOD OF MANUFACTURING A THIN FILM MAGNETIC HEAD

[75] Inventors: Shigeru Syouji; Atsushi Toyoda, both of Hamamatsu, Japan

[73] Assignee: Yamaha Corporation, Hamamatsu, Japan

[21] Appl. No.: 08/703,852

[22] Filed: Aug. 27, 1996

Related U.S. Application Data

[63] Continuation of application No. 08/271,473, Jul. 7, 1994, Pat. No. 5,566,075.

[30] Foreign Application Priority Data

Jul. 15, 1993 [JP] Japan ................................ 5-197974

[51] Int. Cl.[6] .......................... G06F 19/00; B23K 26/00
[52] U.S. Cl. ............................ 364/468.24; 364/474.08; 364/472.01; 219/121.68; 29/603.18
[58] Field of Search .................. 364/468.24, 474.08, 364/472.01; 29/603.12, 603.18; 156/643.1; 219/121.68

[56] References Cited

U.S. PATENT DOCUMENTS

| | | | |
|---|---|---|---|
| 4,333,229 | 6/1982 | Ellenberger | 29/603 |
| 4,785,161 | 11/1988 | Strom | 219/121.69 |
| 4,835,361 | 5/1989 | Strom | 219/121.85 |
| 5,057,184 | 10/1991 | Gupta et al. | 156/637 |
| 5,271,802 | 12/1993 | Chang et al. | 156/643 |
| 5,329,689 | 7/1994 | Azuma et al. | 29/603 |
| 5,531,017 | 7/1996 | Church et al. | 29/603.12 |
| 5,555,145 | 9/1996 | Kajitani | 360/103 |
| 5,567,331 | 10/1996 | Kajitani | 216/22 |

*Primary Examiner*—Paul P. Gordon
*Attorney, Agent, or Firm*—Pillsbury Madison & Sutro LLP

[57] ABSTRACT

A method of manufacturing an air flow type thin film magnetic head includes the steps of providing a slider for a thin film magnetic head; forming a photo-sensitive layer directly on the slider; subjecting the photo-sensitive layer to a light beam having controlled loci to form a desired pattern on the photo-sensitive layer, the loci of the light beam corresponding to the configuration of rails to be formed on a surface of the slider; and forming the rails in accordance with the desired pattern. The loci of the light beam is controlled by a data processor. Various rail patterns including an asymmetrical and non-parallel rail pattern can easily be formed on a slider of a magnetic head.

14 Claims, 4 Drawing Sheets

METHOD OF MANUFACTURING A THIN FILM MAGNETIC HEAD

This is a continuation of U.S. patent application Ser. No. 08/271,473, filed Jul. 7, 1994, now U.S. Pat. No. 5,566,075.

BACKGROUND OF THE INVENTION

This invention relates to a method of manufacturing a thin film magnetic head and, more particularly, to a method of manufacturing an air flow type thin film magnetic head used for devices such as a fixed-head disk device capable of readily processing various rail patterns on a slider for a thin film magnetic head.

An air flow type magnetic head (in this specification, the term "magnetic head" is used for designating an integral body of a slider and a thin film magnetic head) includes, as shown in FIG. 2A, a slider 12 having rails 14 and 16 on the lower surface (i.e., rail surface) thereof and thin film magnetic heads 18 and 20 provided at the rear end portions of these rails 14 and 16. As shown in FIG. 2B, the magnetic head 10 is lifted away from a rotating magnetic disk 22 on account of a hydrodynamic action caused by the rails 14 and 16 and performs recording and reproducing of information on and from the magnetic disk 22 by the thin film magnetic head 18 or 20 while maintaining a non-contacting state with respect to the magnetic disk 22.

An example of a conventional method of manufacturing the magnetic head 10 shown in FIG. 2A will be described with reference to FIG. 3.

(1) A multiplicity of thin film magnetic heads 22 are formed on a wafer 21 by photolithography or other means.

(2) For preventing chipping which may occur during severing of the wafer 21, vertical and transverse indents 24 and 25 are formed on the wafer 21 at locations selected for forming sliders.

(3) The wafer 21 is severed along the transverse indents 25. Each of the severed pieces of the wafer 21 is called a "row" 26.

(4) One surface of each row 26 is ground and polished to form a rail surface 28. A groove 30 is formed on the rail surface 28 by grinding thereby to form the rails 14 and 16.

(5) Each row 26 is severed along the vertical indents 24 to form a plurality of magnetic heads 10.

The rail surface of a conventional air flow type magnetic head normally has the two parallel rails 14 and 16 as shown in FIG. 2A and FIG. 3. For this reason, in processing the rail surface, as shown in FIG. 4, the rails 14 and 16 are normally formed by forming of the groove by direct machining of the rail surface 28 of the row 26 by means of a rotary blade 32.

The amount of lifting of a magnetic head having such parallel rails from the magnetic disk depends upon the relative speed between the magnetic head and the rotating magnetic disk and normally increases as the relative speed increases. Therefore, there has arisen a demand for a constant amount of lifting of the magnetic head regardless of the relative speed between the magnetic head and the magnetic disk and, as one means for satisfying this demand, there has been proposed a magnetic head 38 as shown in FIG. 5 which has asymmetrical and non-parallel rails 34 and 36.

It is extremely difficult to form such asymmetrical and non-parallel rails 34 and 36 by the machining shown in FIG. 4. The asymmetrical and non-parallel rails have therefore been formed by means of a mask pattern by employing a photo-lithography technique. Such prior art processing of the asymmetrical and non-parallel rails will be described below with reference to FIG. 6.

(1) Rows 26 are formed by severing a substrate on which thin film magnetic heads are formed according to the processings (1) to (3) of FIG. 3. After severing, the rail surface 28 of each row is polished.

(2) A photo-sensitive film 40 is formed by coating a resist or laminating a dry film on the rail surface 28.

(3) A photo-mask 42 provided with asymmetrical and non-parallel rails is disposed on the rows 26 arranged in parallel and then is subjected to light exposure.

(4) By developing, the photo-sensitive film is left in the form of the rail pattern to form mask materials 40'.

(5) The surface of the row 26 in a portion where there is no mask material 40' is etched by ion beam etching.

(6) The mask materials 40' are removed and the row 26 is severed into sliders to form a magnetic head 38 having the asymmetrical and non-parallel rails 34 and 36.

The asymmetrical and non-parallel rails can be formed by the processing shown in FIG. 6 but this processing has the disadvantage that the asymmetrical and non-parallel rails are formed in accordance only with a predetermined rail pattern of the photo-mask 42. Particularly, in a case where two or more thin film magnetic heads are formed on a single magnetic head, and one of the thin film magnetic heads has a better characteristic and a rail pattern to be used differs depending upon which thin film magnetic head is used, a rail pattern formed by means of the photo-mask 42 having a fixed rail pattern results in magnetic heads having a rail pattern different from a pattern to be applied to a thin film magnetic head to be used. Thus, this prior art processing has a very poor production efficiency.

It is, therefore, an object of the present invention to provide a method of manufacturing a thin film magnetic head capable of readily processing various rail patterns.

SUMMARY OF THE INVENTION

For achieving the above described object of the invention, there is provided a method of manufacturing a thin film magnetic head comprising the steps of:

(a) providing a slider for a thin film magnetic head;

(b) forming a photo-sensitive layer directly on the slider:

(c) subjecting the photo-sensitive layer to a light beam having controlled loci to form a desired pattern on the photo-sensitive layer, the loci of the light beam corresponding to configuration of rails to be formed on a surface of the slider; and (d) forming the rails in accordance with the desired pattern.

In one aspect of the invention, there is provided a method of manufacturing a thin film magnetic head comprising the steps of:

(a) Providing a wafer;

(b) forming thin film magnetic heads on the wafer;

(c) severing the wafer into a plurality of lots, each of the lots having a plurality of sliders to be severed therefrom;

(d) grinding one surface of each of the lots on which rails are to be formed;

(e) forming a photo-sensitive layer directly on the slider;

(f) subjecting the photo-sensitive layer to a light beam having controlled loci to form a desired pattern on the photo-sensitive layer, the loci of the light beam corresponding to configuration of rails to be formed on the surface of the slider; and (g) forming the rails in accordance with the desired pattern.

In this specification and appended claims, the term "light beam" is used to designate all types of beams available for use to form a desired rail pattern including laser beam, electron beam and ion beam.

According to the invention, a rail pattern is directly plotted by projecting and moving a beam spot such as a laser beam spot over the photo-sensitive film on the rail surface and, therefore, a combination of various rail patterns can readily be formed on each row.

In a case where two or more thin film magnetic heads are to be formed on a single magnetic head, and one of the thin film magnetic heads has a better characteristic and a rail pattern to be used differs depending upon which thin film magnetic head is used, a test for judging whether a particular thin film magnetic head is good or not can be previously made and a proper rail pattern corresponding to the position of a thin film magnetic head which has been selected for use can be formed on the magnetic head. This contributes to improvement of the production efficiency.

According to the invention, in a case where thin film magnetic heads are to be formed on the left and right sides of each magnetic head, a test for judging whether these thin film magnetic heads are good or not is conducted and, if the right side thin film magnetic head is good, a rail pattern for the right side thin film magnetic head is formed. If the left side thin film magnetic head is good, a rail pattern for the left side thin film magnetic film is formed. If both the right and left side thin film magnetic heads are good, a rail pattern for either the right or left side thin film magnetic head is formed. The production efficiency, i.e., yield of production, in manufacturing magnetic heads is thereby improved.

According to the invention, in a case where thin film magnetic heads are to be formed on the right and left sides of each magnetic head and magnetic heads in which the left side thin film magnetic head is used and magnetic heads in which the right side thin film magnetic head is used are required in equal number, a rail pattern formed on a magnetic head in which both the right and left side thin film magnetic heads are good can be determined in such a manner that, for each lot (e.g., one wafer or one row), the number of magnetic heads in which the right side thin film magnetic head is used will become substantially the same as the number of magnetic heads in which the left side thin film magnetic head is used. Therefore, the magnetic heads in which the right side thin film magnetic head is used and the magnetic heads in which the left side thin film magnetic head is used are produced substantially in the same number whereby little waste magnetic head is produced and the production efficiency is improved.

A preferred embodiment of the method according to the invention will be described below with reference to the accompanying drawings.

BRIEF DESCRIPTION OF THE DRAWINGS

In the accompanying drawings.

DESCRIPTION OF PREFERRED EMBODIMENTS

Figure 1:
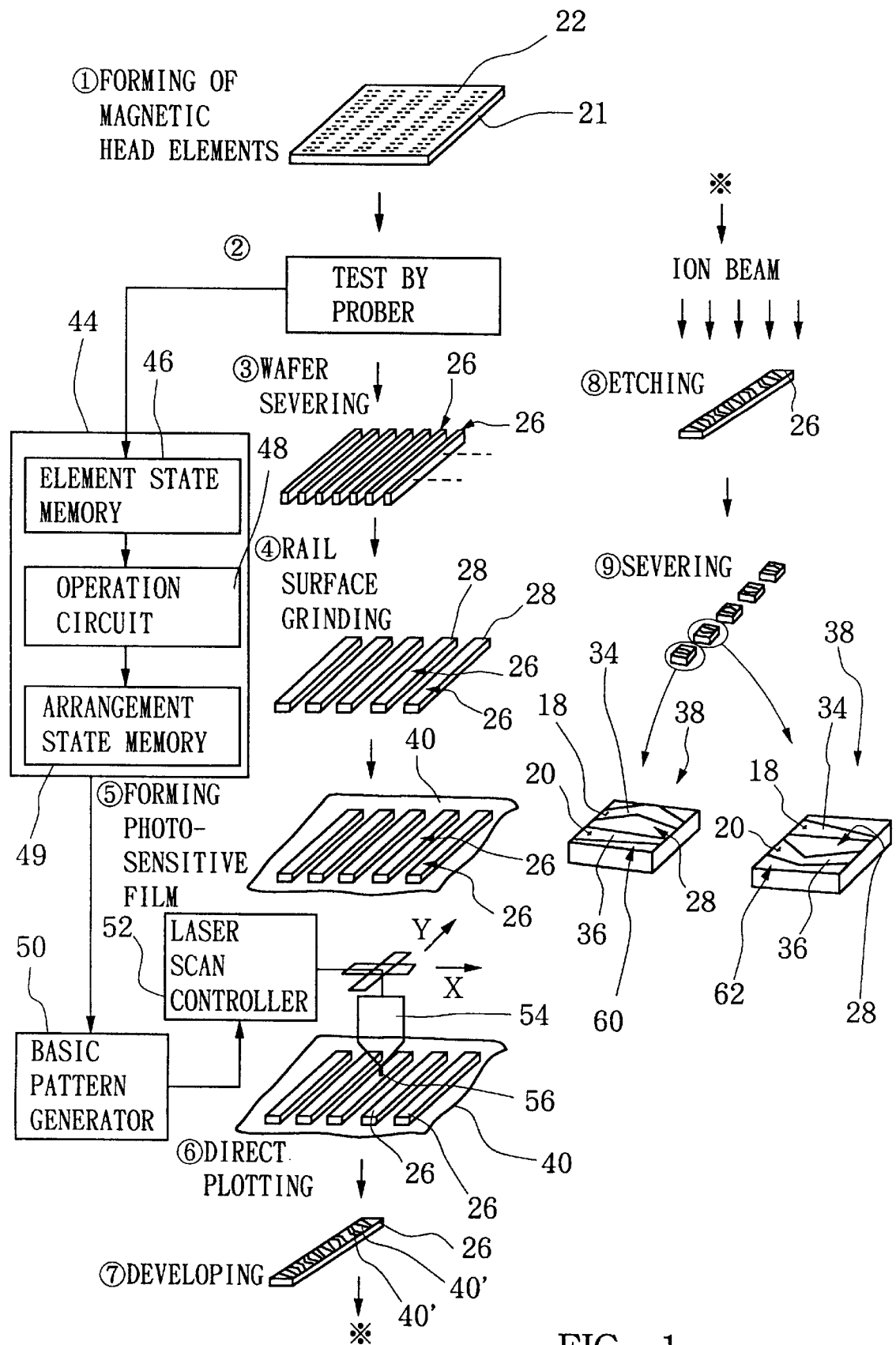
FIG. 1 is a view showing the flow of processing of an embodiment of the method according to the invention.
Figure 2A:
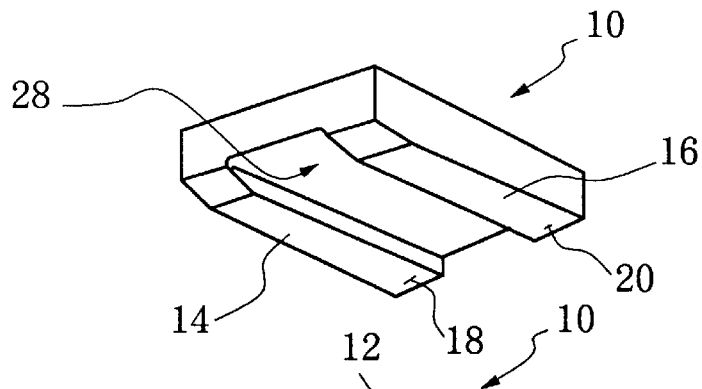
FIG. 2A is a perspective view showing an example of an air flow type magnetic head having parallel rails.
Figure 2B:
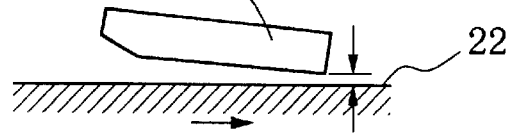
FIG. 2B is a side view showing the same example.
Figure 4:
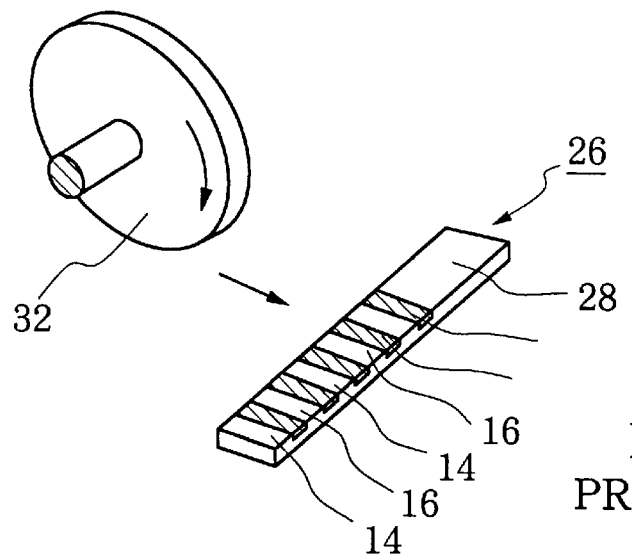
FIG. 4 is a perspective view showing forming of rails by machining.
Figure 5:
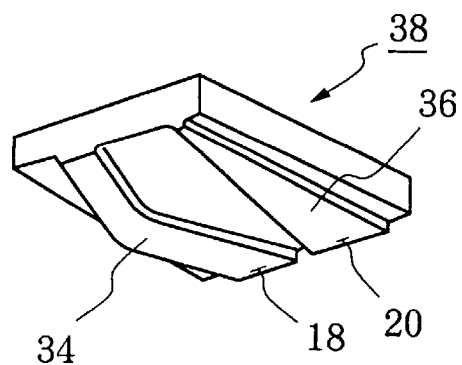
FIG. 5 is a perspective view showing a magnetic head having asymmetrical and non-parallel rails.

An embodiment of the method according to the invention will be described with reference to FIG. 1.

Figure 3:
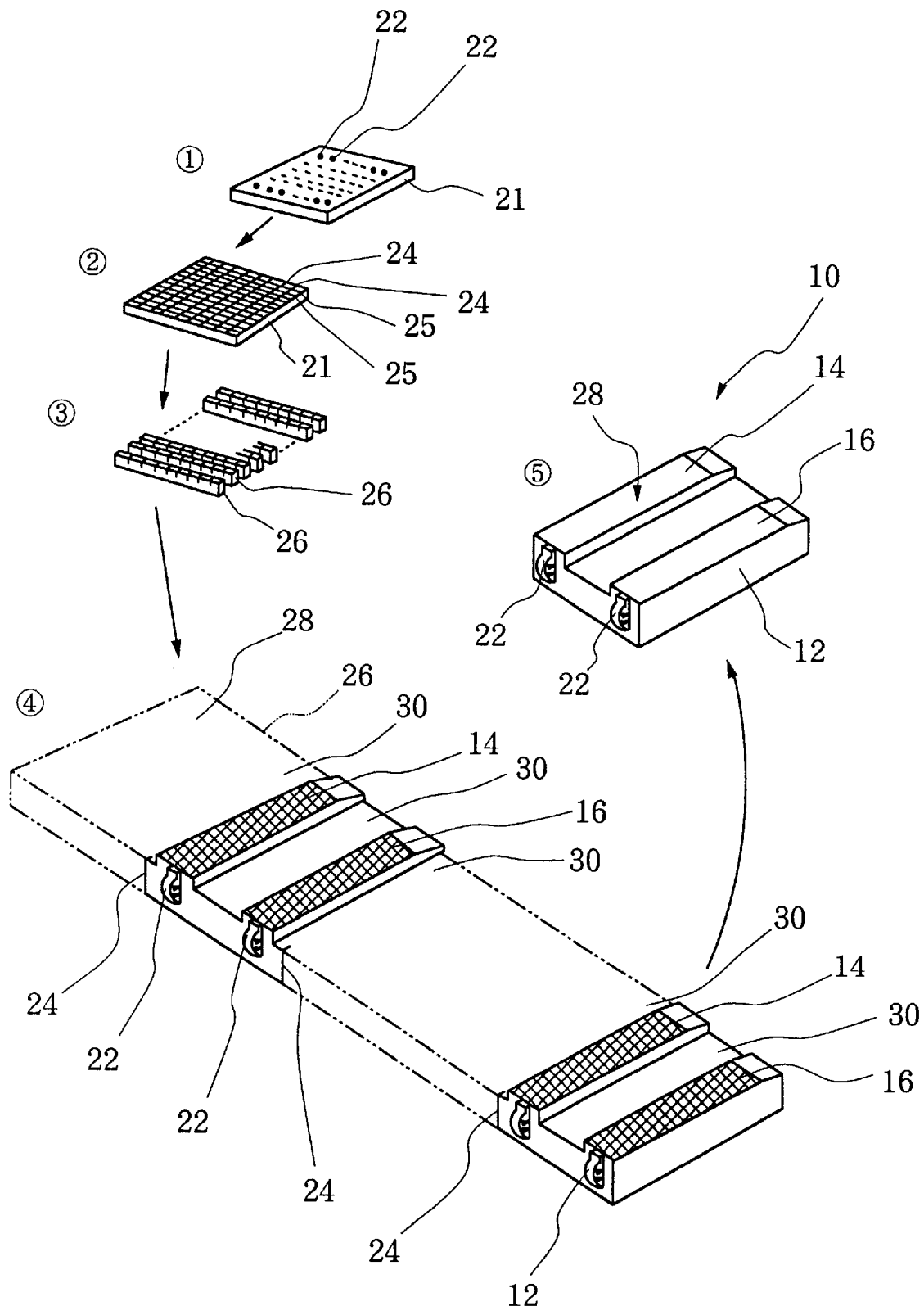
FIG. 3 is a view showing the flow of processing of a prior art method of manufacturing the magnetic head shown in FIGS. 2A and 2B.
Figure 6:
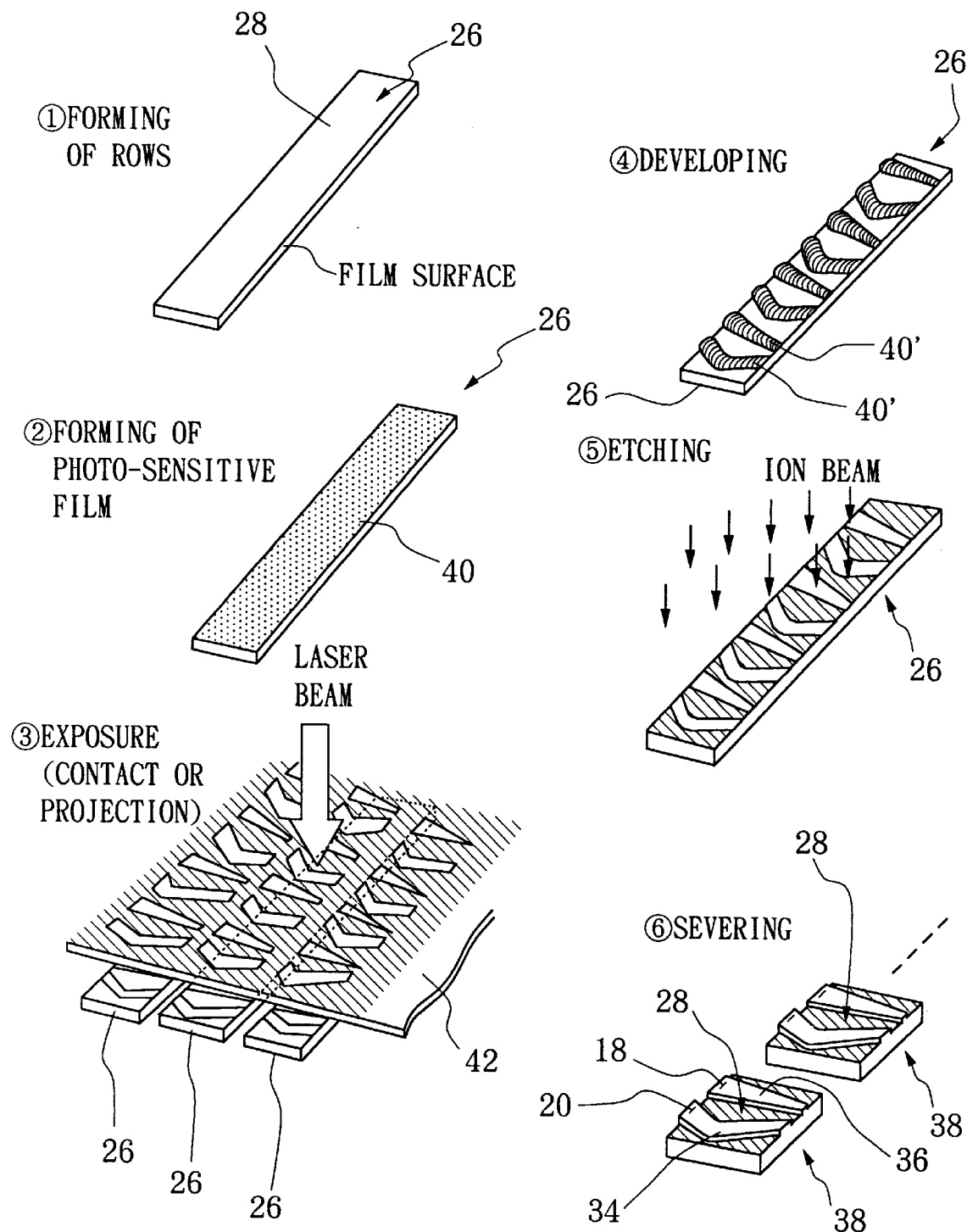
FIG. 6 is a view showing the flow of processing in manufacturing the magnetic head shown in FIG. 5 by using a mask pattern.

(1) A multiplicity of thin film magnetic head elements 22 are formed on a wafer 21 by photo-lithography or other means. The wafer 21 is preferably made of AlTiC. It may also be made of ferrite or titanium oxide calcium. In this embodiment, it is assumed that thin film magnetic heads 22 are formed on both left and right sides of each slider. A surface of the slider facing a magnetic medium is called a "rail surface". A surface of a thin film magnetic head on which a magnetic pole surface is exposed and which is flush with the rail surface is called a "pole surface". As shown in FIG. 3, a surface of the slider on which a thin film magnetic head is provided is called a "film surface". The right side thin film magnetic head element on the film surface is called a "right side element" and the left side thin film magnetic head element on the film surface is called a "left side element".

(2) A test by a prober is conducted for each of the thin film magnetic head elements 22. In a case where different rail patterns are to be formed on a slider in which the right side element is used and a slider in which the left side element is used, information that the right side element is good, the left side element is good or that both elements are good is obtained for each slider by the testing and such information for one lot (e.g., for a single wafer 21 or a single row 26) is stored in an element state memory 46 of a computer 44. The term "lot" is used for designating the number of magnetic heads produced from a single wafer.

An operation circuit 48 in the computer 44 distributes the respective sliders to those for the right side and those for the left side so that the ratio of the magnetic heads in which the right side element is used and the magnetic heads in which the left side element is used will become a desired ratio. In other words, magnetic heads in which the right side element is good are distributed as those for the right side, magnetic heads in which the left side element is good are distributed as those for the left side, and magnetic heads in which both the right and left side elements are good are distributed as either those for the right side or those for the left side so that the ratio between the magnetic heads for the right side and the magnetic heads for the left side for one lot will become a desired ratio.

It is assumed now that the total number of sliders in one lot in which at least a left side element or a right side element is good is designated by N and that the number of sliders in which only the right side element is good is designated by a and the number of sliders in which only the left side element is good is designated by b. In this case, among sliders N−(a+b) in which both the left and right side elements are good, N−2−a is used for the right side and N−2−b is used for the left side (when N is an odd number, the number of sliders for the right side or the left side is increased by one). By distributing the sliders in which both the right and left side elements are good to the right side and left side, magnetic heads for the right side and magnetic heads for the left side can be obtained at a desired ratio. Thus, no waste magnetic head is produced and the best production efficiency can be obtained. In thin film magnetic heads for a fixed-head disk device, one of the right and left elements disposed on the outer peripheral side only is generally used. Magnetic heads are generally used in a pair, that is, one magnetic head is disposed on the upper surface of a magnetic disk recording medium and the other magnetic head on the lower surface of the magnetic disk. Therefore, the right or left side position of the thin film magnetic head disposed on the outer peripheral side is reversed between the upper surface and the lower surface of the magnetic disk. In this case, therefore, by equalizing the number of the magnetic heads in which the right side element is used with the number of the magnetic heads in which the left side element is used, no waste magnetic head is produced and the production efficiency is improved.

The operation circuit 48 determines the state of arrangement of sliders for the right side and sliders for the left side for each row 26 so as to conform the state of arrangement to the result of distribution and stores the state of arrangement in a memory 49.

(3) The wafer 21 is severed into rows 26.

(4) The rail surface 28 on the row 26 is ground.

(5) A photo-sensitive film 40 is formed on the rail surface 28 by coating resist or laminating a dry film on the rail surface 28.

(6) Rail pattern data for the right side and the left side are prestored in a basic pattern generator 50. The computer 48 sequentially reads out the rail patterns for the right side and the left side from the basic pattern generator 50 in accordance wish the state of arrangement of the sliders stored in the arrangement state memory. The computer 48 moves a laser head 54 in X and Y directions by controlling a laser scan controller 52 to project a laser beam spot 56 on the photo-sensitive film 40 with predetermined loci based on rail pattern data and thereby expose the rail patterns. Thus, asymmetrical and non-parallel rail patterns are formed on the rail surface 28 without a fixed pattern mask.

(7) By developing, the photo-sensitive film is left in the form of the rail patterns and mask materials 40' are thereby formed.

(8) By an etching processing such as ion beam etching, powder blasting or reactive etching, a surface of the row 26 in which no mask material 40' exists is etched.

(9) The mask material 40' is removed and the row 26 is severed into sliders. Magnetic heads 38 having asymmetrical and non-parallel rails 34 and 36 formed in different patterns 60 and 62 for the right side and the left side are produced.

The above described embodiment has been described with reference to manufacturing of sliders having asymmetrical and non-parallel rails. The invention however is applicable also to manufacturing of sliders having a parallel rail pattern. For producing a beam spot for plotting the pattern directly, not only a laser beam used in the above described embodiment but other beams such as electron beam and ion beam can be used.

What is claimed is:

1. A method of manufacturing a thin film magnetic head comprising the steps of:

(a) providing a slider for a thin film magnetic head;

(b) forming a photo-sensitive layer directly on the slider;

(c) subjecting the photo-sensitive layer to a light beam having a controlled loci to form a desired pattern on the photo-sensitive layer, the loci of the light beam corresponding to configuration of rails to be formed on a surface of the slider; and (d) forming the rails in accordance with the desired pattern.

2. A method according to claim 1, wherein the loci of the light beam is controlled by a data processor.

3. A method according to claim 1, wherein, in the step (d), the rails are formed asymmetrically with respect to a center line on the surface of the slider.

4. A method according to claim 1, wherein, in the step (d), each of the rails provided on the slider has a different shape.

5. A method of manufacturing a thin film magnetic head comprising the steps of:

(a) providing a slider for a thin film magnetic head;

(b) forming a photo-sensitive layer directly on the slider;

(c) subjecting the photo-sensitive layer to a light beam having a controlled loci to form a desired pattern on the photo-sensitive layer, the loci of the light beam corresponding to configuration of rails to be formed on a surface of the slider;

(d) developing the photo-sensitive layer to form the desired pattern; and (e) forming the rails in accordance with the desired pattern.

6. A method according to claim 1, wherein the step (d) further comprises the step of:

(d-1) etching a surface of the slider through the desired pattern on the photo-sensitive layer based on data stored in a memory.

7. A method according to claim 6, wherein the etching step (d-1) is performed by dry etching.

8. A method according to claim 7, wherein the dry etching is performed by either ion beam, reactive ion etching, or powder blasting.

9. A method according to claim 1, wherein the step (c) is performed without a photo-mask.

10. A method according to claim 1, wherein, in the step (c), the slider is made of AlTiC.

11. A method of manufacturing a thin film magnetic head comprising the steps of:

(a) providing a slider for a thin film magnetic head having a plurality of magnetic elements;

(b) testing the characteristics of the magnetic elements of the thin film magnetic head to determine if the elements are good;

(c) selecting a rail pattern for the slider based on the results of step (b) to maximize usable slider yield; and (d) forming rails in accordance with the selected rail pattern.

12. A method according to claim 11, further comprising the following steps after step (c):

(c-1) forming a photo-sensitive layer directly on the slider;

(c-2) subjecting the photo-sensitive layer to a light beam having a controlled loci to form a desired pattern on the photo-sensitive layer, the loci of the light beam corresponding to the configuration of rails to be formed on the surface of the slider.

13. A method according to claim 12, wherein the loci of the light beam is controlled by a data processor.

14. A method according to claim 12, further comprising the following step after step (c-2), (c-3) developing the photo-sensitive layer to form the selected rail pattern.

* * * * *